US008539397B2

(12) United States Patent
Sudhakar et al.

(10) Patent No.: US 8,539,397 B2
(45) Date of Patent: Sep. 17, 2013

(54) SUPERSCALAR REGISTER-RENAMING FOR A STACK-ADDRESSED ARCHITECTURE

(75) Inventors: Ranganathan Sudhakar, Santa Clara, CA (US); Daryl Lieu, Sunnyvale, CA (US); Debjit Das Sarma, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1094 days.

(21) Appl. No.: 12/482,977

(22) Filed: Jun. 11, 2009

(65) Prior Publication Data

US 2010/0318772 A1  Dec. 16, 2010

(51) Int. Cl.
*G06F 17/50* (2006.01)

(52) U.S. Cl.
USPC .......................................... 716/100; 716/101

(58) Field of Classification Search
USPC .................................. 716/100–104
See application file for complete search history.

(56) References Cited

U.S. PATENT DOCUMENTS

| 5,179,702 | A | 1/1993 | Spix |
| 5,630,149 | A | 5/1997 | Bluhm |
| 5,632,023 | A | 5/1997 | White et al. |
| 5,651,125 | A | 7/1997 | Witt et al. |
| 5,784,589 | A | 7/1998 | Bluhm |
| 5,805,853 | A | 9/1998 | White et al. |
| 5,878,244 | A | 3/1999 | Witt et al. |
| 5,884,059 | A | 3/1999 | Favor et al. |
| 5,978,901 | A | 11/1999 | Luedtke |
| 6,119,223 | A | 9/2000 | Witt |
| 6,122,656 | A | 9/2000 | Witt |
| 6,266,763 | B1 | 7/2001 | Witt et al. |
| 6,636,959 | B1 * | 10/2003 | Keller et al. ................... 712/204 |
| 7,724,036 | B2 * | 5/2010 | Das ................................ 326/93 |
| 8,037,429 | B2 * | 10/2011 | Shang et al. ..................... 716/53 |
| 8,108,812 | B1 * | 1/2012 | van Antwerpen et al. ..... 716/104 |
| 2004/0168043 | A1 * | 8/2004 | Keller et al. ................... 712/207 |
| 2006/0248319 | A1 * | 11/2006 | Kadambi ....................... 712/234 |
| 2008/0301620 | A1 * | 12/2008 | Ye et al. ........................... 716/19 |

* cited by examiner

*Primary Examiner* — Binh Tat
(74) *Attorney, Agent, or Firm* — Rory D. Rankin; Meyertons, Hood, Kivlin, Kowert & Goetzel, P.C.

(57) ABSTRACT

A system and method for increasing processor throughput by decreasing a loop critical path. In one embodiment, a table comprises multiple stack entries, each comprising an x87 floating-point (FP) stack specifier. The combinatorial logic for operand translation of N FP instructions per clock cycle may require N instantiated copies of a combinatorial logic block. Each instantiated copy may determine a new ordering of the stack entries. Control logic may receive necessary information from the corresponding N FP instructions and determine a corresponding combined computational effect, or stack reordering, on entries within the table based on two or more instructions. Resulting control signals are conveyed to the N instantiated copies. A resulting accumulative delay from an input of the first copy to the output of the Nth copy may be less than or equal to (N−1)*time_delay versus a longer N*time_delay.

20 Claims, 10 Drawing Sheets

SUPERSCALAR REGISTER-RENAMING FOR A STACK-ADDRESSED ARCHITECTURE

BACKGROUND OF THE INVENTION

1. Field of the Invention

This invention relates to computing systems, and more particularly, to increasing processor throughput by decreasing a loop critical path.

2. Description of the Relevant Art

The demand for ever-increasing throughput of processors, or the number of instructions retired per clock cycle (IPC), has followed different techniques. Maintaining a particular clock frequency, one approach to increase processor throughput is superscalar processing, which allows multiple instructions to be processed in a same pipeline stage per clock cycle. Generally speaking, assuming instructions do not experience data hazards or other pipeline stalls, a particular processor architecture that is able to dispatch, decode, issue, execute, and retire 3 instructions per clock cycle triples the throughput of a processor that doesn't implement superscalar processing. In actual operation, instructions do experience pipeline stalls. Therefore, the actual throughput will vary depending on the microarchitecture of the processor and the software application(s) being executed.

In addition to out-of-order issue of instructions to execution units within a superscalar microarchitecture, register renaming is another method that increases processor throughput. Register renaming dynamically renames register destination and source operands via the hardware. Register renaming reduces name dependences and allows a higher level of parallelization in code execution.

Further, increasing the rate of the clock, or the clock frequency, that synchronizes sequential elements on the processor die increases processor throughput. As the clock frequency increases, the processor's power consumption and temperature also increase. Therefore, design techniques such as clock gating may be utilized on the die. Still, outside of power consumption concerns, the processor clock frequency may not increase beyond a physical threshold rate at which signals traverse the processor between sequential elements and through combinatorial logic. Such a signal path that limits the clock cycle of a processor is referred to as a critical path. Typically, critical paths are determined during pre-silicon timing analysis when setup time violations are noted.

Each generation of a superscalar processor design may increase the instruction issue width, such as being capable of issuing 4 instructions out-of-order to execution units in a single clock cycle, rather than 3 instructions. Also, the clock period may be reduced. Among noise, area, power, hold time, and other design criteria, critical paths need to be resolved in order to satisfy these design requirements. One solution includes moving segments of combinatorial logic of a critical path to a previous or subsequent clock cycle corresponding to a pipeline stage that has more allowable computation time. However, more sequential elements may be required to save a new intermediate state, which increases clock power and reduces available real estate on the die.

Even if such a solution described above is viable, it won't resolve a loop critical path. A loop critical path begins with a particular sequential element, such as a flip-flop, traverses through wire routes and combinatorial logic of the path, and terminates at the same particular sequential element. Splitting this path with a second sequential element involves adding a costly pipeline stage to the design. In addition, a loop critical path may experience incorrect operation due to the second sequential element. The first half of a split path may not receive the correct output signals from corresponding flops, which are now receiving a cycle delayed output from the second half of the split path. In order to avoid incorrect operation, a stall may need to be inserted in the pipeline and the loop delay has grown to two costly clock cycles. For processor performance, it may be desirable to maintain this loop delay within one originally predetermined clock cycle.

An example of a loop critical path is the translation of stack-relative legacy x87 register specifier values. In a microarchitecture supporting execution of an x86 instruction set architecture (ISA), prior to a pipeline stage that performs superscalar register renaming of floating-point operands, translation of stack-relative x87 register specifiers is performed for floating-point instructions. Briefly, the x87 floating-point unit (FPU) uses an 8-entry table, which holds relative offsets with reference to a top-of-stack (TOS) value. The changes, or effects, a particular instruction has on the translate-table is dependent both on the operation of the particular instruction and on the effects of a prior instruction. Therefore, translation may become a serial process.

The logic for this process may consist of N identical cascaded copies of logic, where N is the number of instructions to be translated and whose operations affect the placement order of the contents within the translate-table. Each copy of translate logic performs the translation for one instruction based on both incoming current translate-table values and the particular operation of the instruction. Each copy of logic creates new translate table values at its output, which is then used as input values to a subsequent copy of logic. The critical path through the entire cascaded translate logic is simply proportional to N times the delay through one copy of logic.

The total amount of delay described above may not fit within a desired processor clock cycle when a design increases the width of the x87 floating-point translation logic from N to N+1 or the design decreases its clock cycle duration. Dividing the total path by placement of sequential elements within the path adds an undesirable and costly pipeline stage. However, not increasing the width from N to N+1 limits the throughput of subsequent rename, issue, and retire pipeline stages.

In view of the above, efficient methods and mechanisms for increasing the throughput of processors by decreasing loop critical path delay are desire.

SUMMARY OF THE INVENTION

Systems and methods for increasing processor throughput by decreasing loop critical path delay are contemplated. In one embodiment, a system is provided comprising a table comprising a plurality of entries and a control signal generation block conveying control signals to N instantiated copies of combinatorial logic. In one embodiment, each entry of the table comprises a relative stack specifier, such as an x87 floating-point (FP) stack specifier. Each copy of the instantiated copies may originally perform a computational effect, such as a stack operation used to translate operands of a corresponding FP instruction, on a current status of the table. For example, a FP ADD instruction may correspond to a stack pop operation, a FP Load instruction may correspond to a push operation, and so forth. Therefore, if N instructions are to be translated within a clock cycle, then the total delay may be N*time_delay, wherein each copy of the N instantiated copies has a same logic delay of time_delay to convey its data output signals.

In one embodiment, the control signal generation block may receive the opcodes and other necessary fields, such as a specifier in the FXCH instruction, in order to determine a corresponding combined computational effect on an 8-entry stack within the table. In one embodiment, the computational effect is a reordering of the entries based on two FP instructions within a clock cycle. In another embodiment, the control signal generation block may be able to determine a reordering based on three or more FP instructions within a clock cycle. Resulting select lines or other control signals are subsequently conveyed to the N instantiated copies of combinatorial logic. A resulting accumulative delay from a data input line of a first copy to a data output line of the Nth copy may be less than or equal to (N−1)*time_delay. Now, a pipeline stage may increase the number of instructions per clock cycle to issue, since a particular operation, such as an instruction operand translation, may be performed on an increased number of instructions without increasing the clock cycle time.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
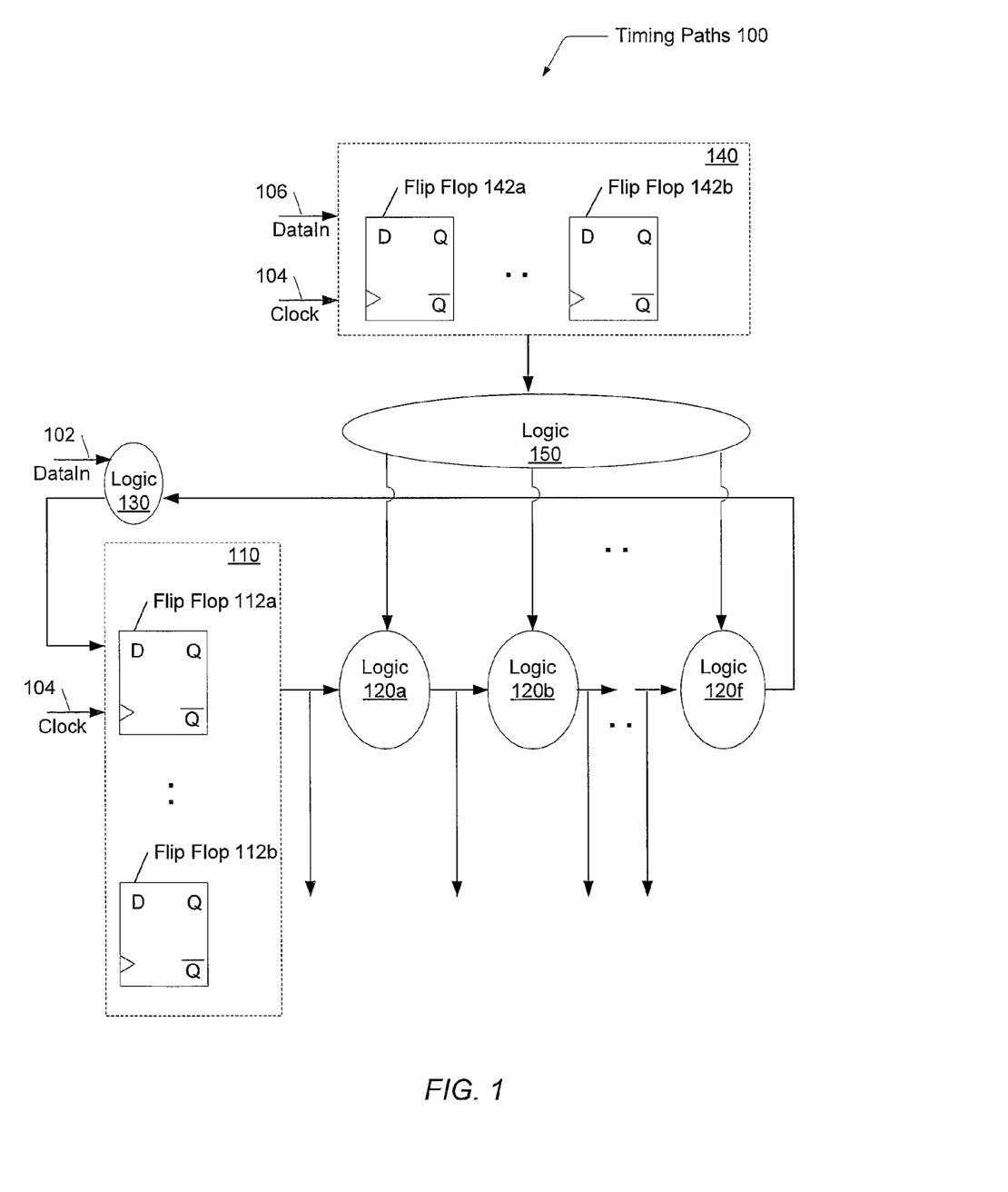
FIG. 1 is a generalized block diagram illustrating one embodiment of processor timing paths.

Referring to FIG. 1, one embodiment of processor timing paths 100 is shown. This particular embodiment has sequential elements 110 and 140 as a border between two pipeline stages. Sequential elements 110 and 140 have positive-edge triggered flip-flops 112a-112b and 142a-142b, respectively, comprising pass-gates, or transmission gates, to implement a master latch and a slave latch. As used herein, elements referred to by a reference numeral followed by a letter may be collectively referred to by the numeral alone. For example, flip-flop circuits 112a-112b may be collectively referred to as flip-flop circuits 112. One skilled in the art knows other embodiments of flip-flops 112 and 142 may include a negative-edge triggered design, and the master-slave configuration may be implemented with other transistor topologies such as sense amps, C2MOS topology, dynamic circuits, differential inputs, and other design choices. Sequential elements 110 and 140 may each have a different number of flip-flops from one another depending on the number of data and control signals each needs to convey to a subsequent pipeline stage.

Output data conveyed on one or more signal routes from combinatorial logic, dynamic logic, sequential elements, such as latches or other flip-flop circuits; or other is received by data input lines DataIn 102 and 106. Both DataIn 102 and 106 comprise one or more data lines to receive data and control signals. In one embodiment, sequential elements 110 and 140 comprise one flip-flop for each data or control signal conveyed by the output of Logic 130 and received by DataIn 106, respectively.

A clock signal is received by clock line 104. In this embodiment, flip-flops 112 and 142 receive a same clock signal, Clock, on line 104. A transition of the clock signal (i.e. changing from a logic low value to a logic high value in the positive-edge triggered example) initiates logic value state changes within the flip-flop circuits 112 and 142.

The outputs of flip-flops 112 are conveyed both to combinatorial logic, Logic 120a, and to combinatorial logic or to other sequential elements not shown. Combinatorial logic, Logic 120a, receives the output of flip-flops 112, performs combinatorial computations dependent on the output of flip-flops 112, and conveys one or more output values to the input of Logic 120b. Also, the output values of Logic 120a are conveyed to other combinatorial logic or sequential elements not shown.

In addition, Logic 120a receives the output of combinatorial logic, Logic 150, which performs combinatorial computations dependent on the output of flip-flops 142. In one embodiment, Logic 120a comprises one or more stages of multiplexers, wherein the outputs of flip-flops 112 supply input data to be potentially selected and the outputs of Logic 150 supply select line values for the multiplexers.

In one embodiment, the output of Logic 120a is simply a reorder of the inputs to Logic 120a. For example, in one embodiment, sequential elements 110 may comprise eight 3-bit registers, or 24 flip-flops in total, such as Table_Entry0[2:0] through Table_Entry7[2:0]. Each register value is received as an input by Logic 120a. Logic 120a may comprise eight 8:1 multiplexers. Each multiplexer may receive as an input each register value from Table_Entry0[2:0] to Table_Entry7[2:0]. Select line values comprising 3 bits may be supplied to each multiplexer from Logic 150.

Figure 2:
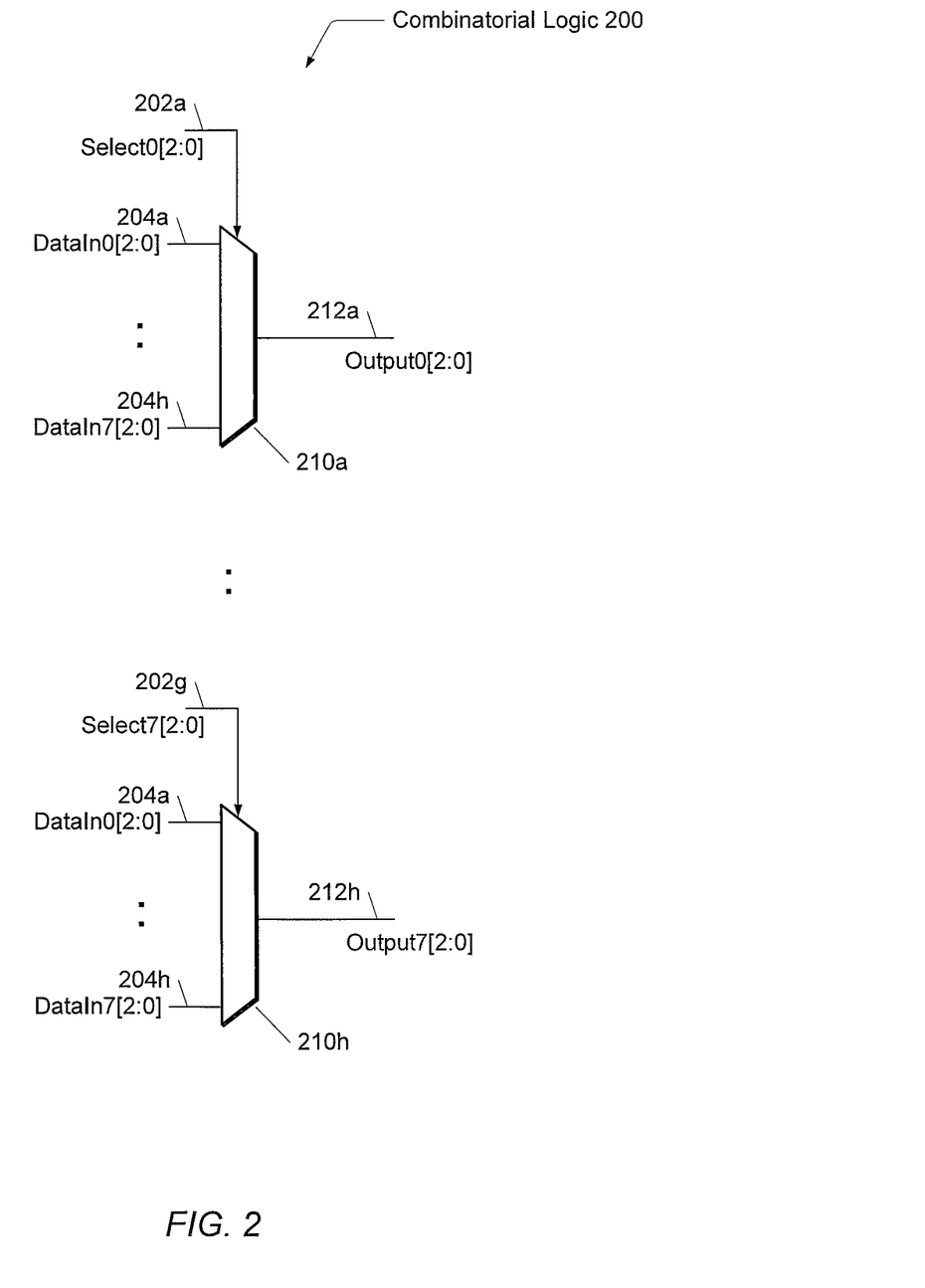
FIG. 2 is a generalized diagram illustrating one embodiment of combinatorial logic within a logic stage of a loop critical path.

Referring to FIG. 2, one embodiment of combinatorial logic 200 within a logic stage, such as Logic 120a, of a loop critical path is shown. In one embodiment, combinatorial logic 200 simply reorders the placement of the incoming signal buses. For example, the inputs may be ordered DataIn0[2:0] to DataIn7[2:0] for each of the eight multiplexers. However, the outputs of the combinatorial logic 200 may be ordered DataIn4[2:0] to DataIn7[2:0] followed by DataIn0[2:0] to DataIn3[2:0]. In this embodiment, an input bus is placed on one and only one output bus. This example output is simply a rotation of the inputs by 4 places.

In one embodiment, each multiplexer 210 receives eight 3-bit input signals, DataIn0[2:0] 204a to DataIn7[2:0] 204h, and conveys a 3-bit output signal, such as Output0[2:0] 212a. In this embodiment, each of the eight multiplexers 210 chooses one input value of the available input values 204 to convey on its output lines, which is different from the output values of the other seven multiplexers. Each multiplexer 210 may receive its own 3-bit select value on bus 202.

Figure 3:
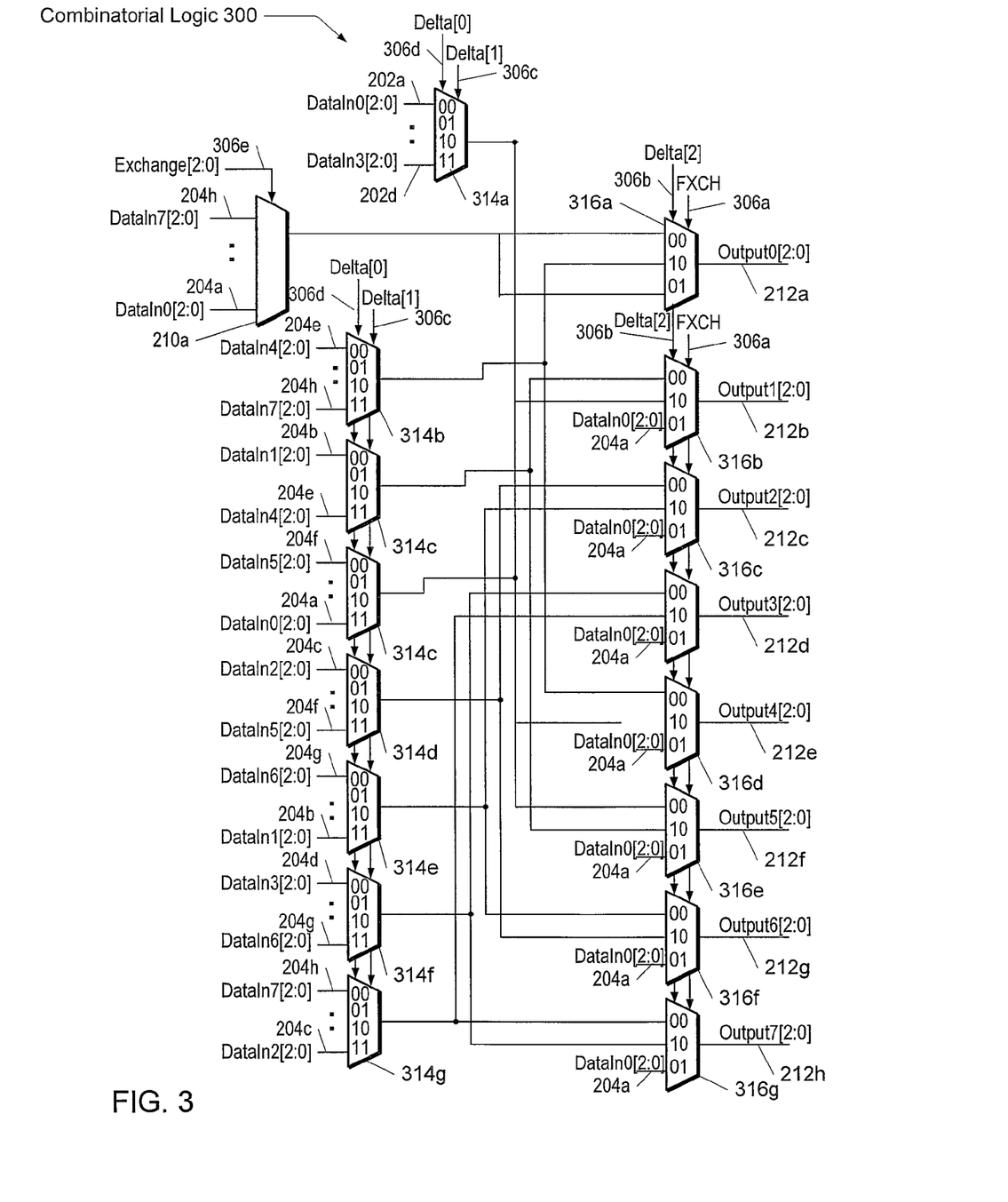
FIG. 3 is a generalized logic diagram illustrating one embodiment of combinatorial logic within a logic stage of a loop critical path that utilizes less select lines.

In order to reduce the number of select lines required for the multiplexers, such as reducing the 24 select lines shown (3 select lines for each of 8 multiplexers), a smaller number of select lines that are routed to multiple multiplexers may be utilized. These select lines may be routed to multiple multiplexers, and each multiplexer arranges its input data lines in a different order. FIG. 3 illustrates one embodiment of combinatorial logic 300 that utilizes less select lines. Circuitry and signals corresponding to those in FIG. 2 are numbered accordingly. In this particular embodiment, for seven of the eight output buses 212, a 3:1 multiplexer 316 is utilized to choose between the outputs of two 4:1 multiplexers 314 and the data input 204a. Each of the 4:1 multiplexers 314 has its input data lines 204 arranged in a manner that allows it to share select lines with the other multiplexers 314, such as Delta[1] 306c and Delta[0] 306d. The same is true regarding the 3:1 multiplexers 316 and the select lines FXCH 306a and Delta[2] 306b.

In this embodiment, a FP exchange instruction swaps the value on DataIn0[2:0] 204a with another data input 204 specified by the instruction. The select lines exchange[2:0] 306e and FXCH 306a may be set according to decode combinatorial logic that receives the incoming FP exchange instruction. Multiplexers 210a chooses the corresponding data input line 204 to swap with DataIn0[2:0] 204a. If there is no FP exchange instruction being decoded, the output buses 212 may be determined based on other FP stack operations such as pop, double pop, push, and nothing. The arrangement of the data input lines 204 are set according to these instructions and the arrangement of the select lines Delta[2] 306b, Delta[1] 306c, and Delta[0] 306d.

In this particular embodiment, 7 select lines are utilized for determining which of the 8 incoming data buses 204 should be routed to each of the 8 output buses 212. This particular embodiment utilizes a much smaller number of select lines than the embodiment shown in FIG. 2 (7 select lines versus 24 select lines). This embodiment is shown to illustrate that the number of select lines may be reduced if a need arises due to routing congestion, increased signal line capacitance, increased clock power from flip-flops storing the select line values, or other Referring again to FIG. 1, in one embodiment, Logic 120b is a copy of the combinatorial logic within Logic 120a. For example, Logic 120a may comprise the eight 8:1 multiplexers shown in FIG. 2. Logic 120b may comprise an instantiation of this logic. Therefore, Logic 120b has the same or a very similar delay as Logic 120a. The output values of Logic 120b are both conveyed to other combinatorial logic or sequential elements not shown and conveyed to the input of a subsequent instantiation of a copy of Logic 120a. In one embodiment, the output of Logic 120b is a subsequent reordering of the register values stored in sequential elements 110 following an initial reordering performed by Logic 120a. This subsequent reordering may be dependent on both the reordering performed by Logic 120a and input signals from Logic 150, which may comprise select line values for multiplexers.

For example, in one embodiment, sequential elements 110 may comprise an eight entry translate table, which stores offset values relative to a top-of-stack (TOS) value. A more detailed description of this translate-table and its use is provided later. Briefly, this TOS value may change after the completion of an operation, such as a processor instruction. The combinatorial logic in Logic 120 may determine the changes that will be caused by a processor instruction to the TOS value and the corresponding ordering of the other seven entries. The instruction has not yet been scheduled for execution, but the flat address value needs to be determined in order for the operand register specifier to be renamed and scheduled for execution along with the corresponding instruction.

Figure 4:
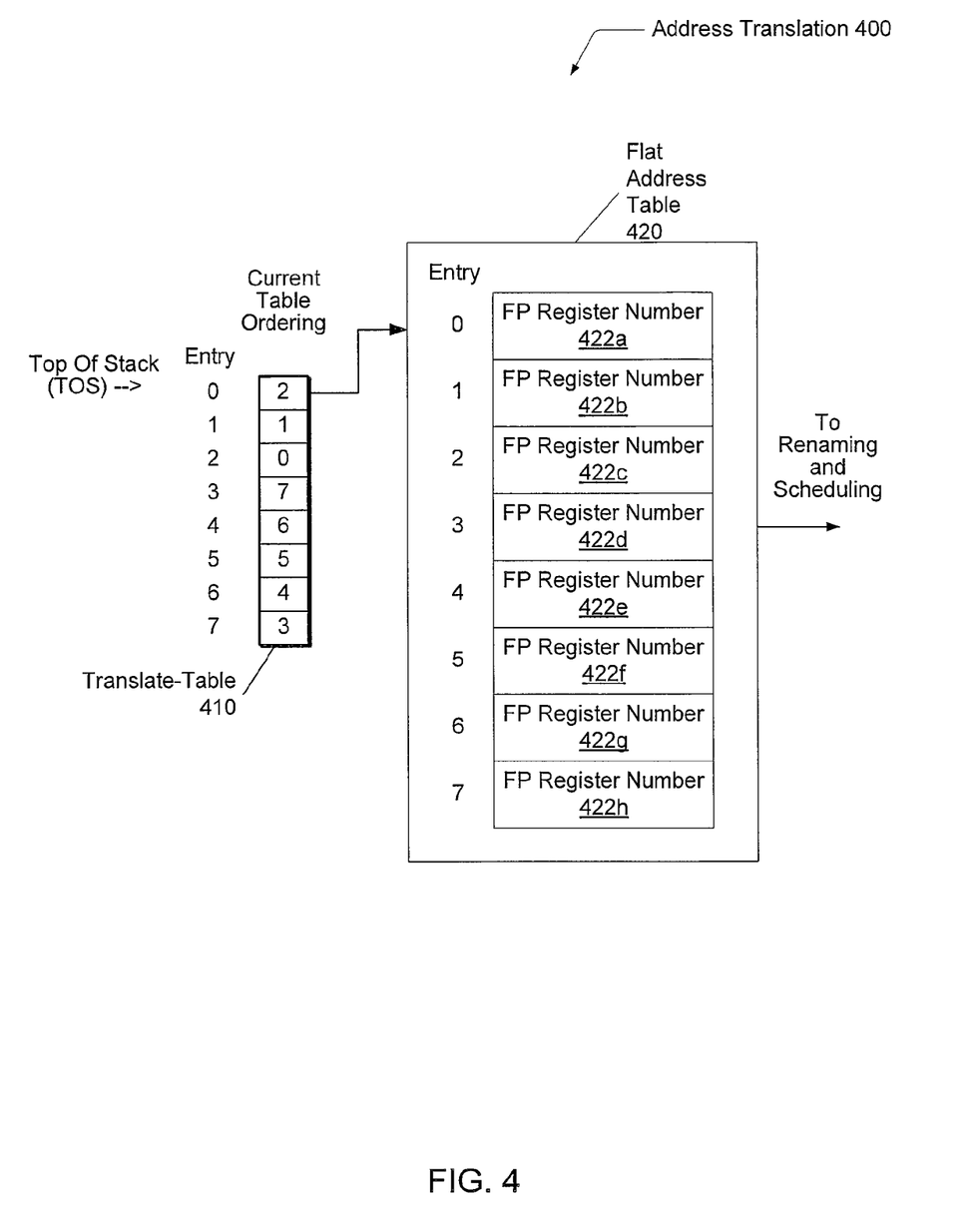
FIG. 4 is a generalized block diagram illustrating one embodiment of stack-based address translation.

FIG. 4 illustrates one embodiment of stack-based address translation 400. An 8-entry flat address table 420 may store floating-point (FP) register numbers 422 that specify which register of a group of 8 64-bit floating-point registers is to be used as a source operand for a particular FP instruction. Table 420 may be indexed by 3-bit values stored in a translate table 410. In one embodiment, for a microarchitecture supporting execution of an x86 instruction set architecture (ISA), prior to a pipeline stage that performs superscalar register renaming of floating-point operands, translation of stack-relative x87 register specifiers is performed for floating-point instructions.

In one embodiment, for FP instructions, in order to efficiently use bits within the FP instruction, it may be predetermined that a destination operand and a first source operand are specified by a TOS value. For example, in FIG. 4, a current TOS value stored in translate table 410 may be the 3-bit value 2 as shown. This value of 2 may be used to index the flat address table 420, which outputs the value stored in entry 2, or the FP register number 422c.

In one example, a FP ADD instruction may specify an offset value of 4 within the instruction. Therefore, the destination operand and the first source operand utilize the FP register specified by entry 2 of table 420, which is FP register number 422c. The second source operand is specified by the second instruction to be 4 entries away from the predetermined destination and first source operands. The second source operand is specified by entry 6 (2+4) of table 410. Therefore, the 3-bit stored value of 4 is utilized to index table 420. The second source operand for this particular FP ADD instruction is specified by entry 4 of table 420, or FP register number 422e.

However, before a subsequent FP instruction is able to utilize tables 410 and 420, translate table 410 needs to be updated. The operation of a completed FP ADD instruction causes a pop operation to occur on table 410. Therefore, the current TOS value, 2, is moved from entry 0 to entry 7. All other entries are rotated up and the new TOS value stored in entry 0 is 1.

Figure 5:
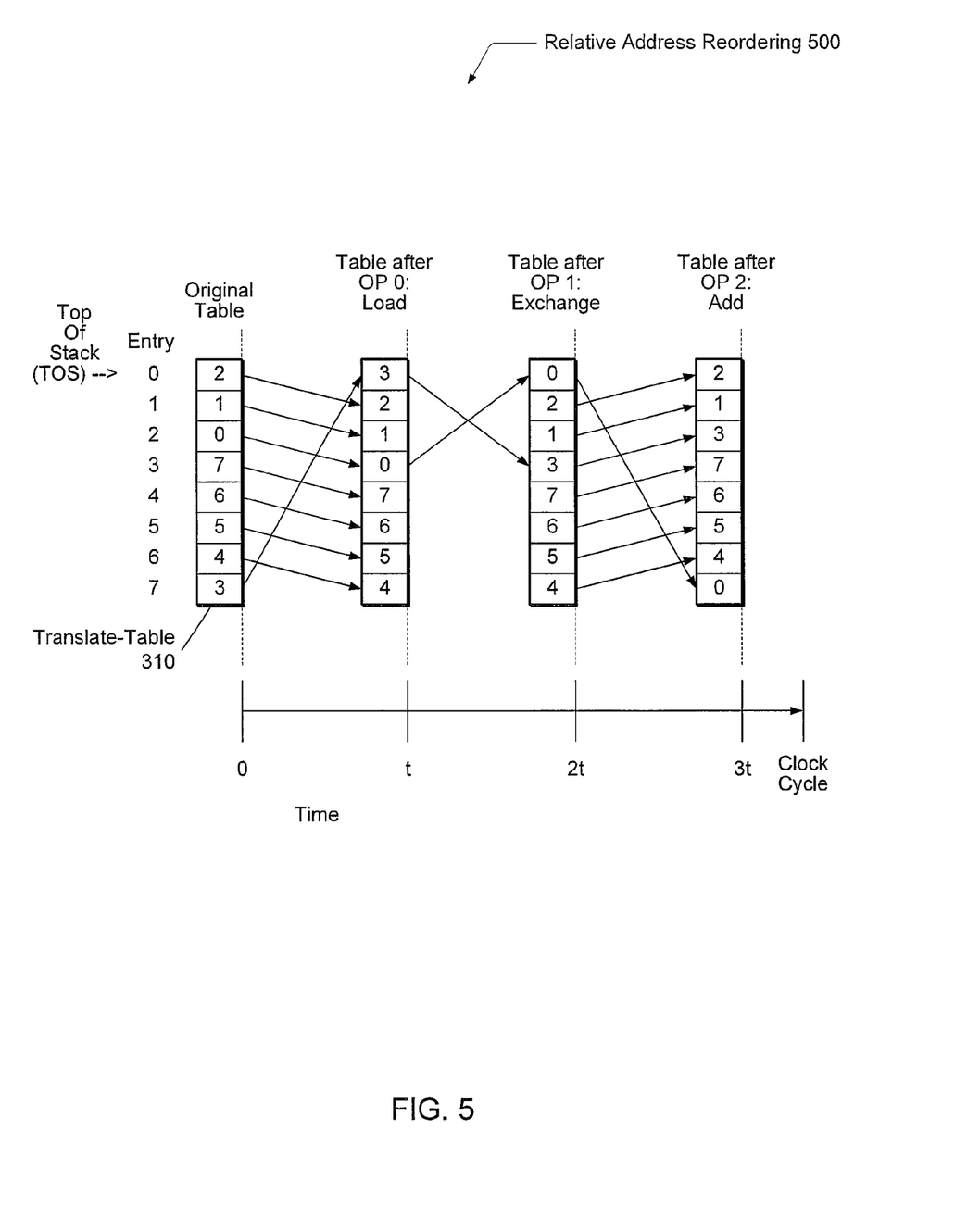
FIG. 5 is a generalized block diagram illustrating one embodiment of relative address reordering.

FIG. 5 illustrates one embodiment of relative address reordering 500. In the example shown, at the beginning of a clock cycle, the original translate-table values stored within entries 0 to 7 are 2 to 0 and 7 to 3 as shown. In the embodiment shown, three instructions are able to have their corresponding operands translated within a single clock cycle.

A FP load instruction has been fetched and decoded. Now in the current clock cycle, the current stored values and current ordering of table 310 determines the destination and source operands of the FP load instruction. The appropriate values, such as the TOS value stored in entry 0 (e.g. 2) and the value stored in an entry specified by an offset within the FP load instruction, are used to index table 320. The corresponding values of table 320 are read out and input to flip-flops for register renaming in the subsequent clock cycle.

Prior to operand renaming and scheduling, it is possible to determine the effect, or reordering, of the translate-table 310 values based on this FP load instruction. A FP load instruction acts like a push operation on a stack upon completion of its operation. Currently, the value 2 is the TOS value. The TOS value stored in entry 0 is moved to entry 1. Accordingly, the contents of all other entries except entry 7 are rotated down by one entry. The 3-bit value stored in entry 7 is moved to entry 0 and becomes the new TOS value as shown. In one embodiment, the combinatorial logic within Logic 120a may perform these changes and convey the reordering values to Logic 120b.

Following, within the same clock cycle, it is seen that a FP exchange instruction (FXCH) occurs that exchanges the contents of entry 0 with an entry specified by the FP exchange instruction. In the example shown, the FXCH instruction specifies entry 3. The stored values and current ordering of table 310 determines the destination and source operands of the FP exchange instruction. In this case, these values are not read from registers, but from the output of combinatorial logic within Logic 120a. The appropriate values, such as the TOS value stored in entry 0 (e.g. 3) and the value stored in an entry 3 (e.g. 0) specified by the FP exchange instruction, are used to index table 320. The corresponding values of table 320 are read out and input to flip-flops for register renaming in the subsequent clock cycle.

Next, in one embodiment, combinatorial logic within Logic 120b performs the reordering on the translate-table 310 values, which are now values output from Logic 120a, based on this FP exchange instruction. Currently, the value 3 is the TOS value. The TOS value stored in entry 0 is moved to entry 3, and vice-versa. No other value is moved. In one embodiment, the combinatorial logic within Logic 120b conveys this new reordering of the values to Logic 120f, which is shown in FIG. 1 as the last instantiation of a copy of the combinatorial logic found in Logic 120a.

Now a FP ADD instruction occurs, which acts as a pop operation on a stack. The stored values and current ordering of table 310 determines the destination and source operands of the FP ADD instruction. Again, in this case, these values are not read from registers, but from the output of combinatorial logic within Logic 120b. The appropriate values, such as the TOS value stored in entry 0 (e.g. 0) and the value stored in an entry specified by the FP ADD instruction, are used to index table 320. The corresponding values of table 320 are read out and input to flip-flops for register renaming in the subsequent clock cycle.

Next, in one embodiment, combinatorial logic within Logic 120f performs the reordering on the translate-table 310 values, which are now values output from Logic 120b, based on this FP ADD instruction. Currently, the value 0 is the TOS value. The TOS value stored in entry 0 is moved to entry 7 and all other values are rotated up.

Referring again to FIG. 1, Logic 120f represents a last cascaded instantiation of the copied combinatorial logic. In one embodiment, unlike the outputs of Logic 120a-120b, the output of Logic 120f is not conveyed to other combinatorial logic or sequential elements. Rather, the output of Logic 120f is only conveyed to combinatorial logic within Logic 150, such as a multiplexer, which conveys an output to sequential elements 110.

In one embodiment, the longest signal delay in timing paths 100 comprises the clock-to-q delay of flip-flop 112, the accumulative delay through each copy of combinatorial logic, Logic 120, the delay through Logic 150, and, finally, the setup time of flip-flop 112. This signal delay is a loop delay. The main component of this total loop delay may be the accumulative delay through each copy of combinatorial logic, Logic 120. In one example, if there are three copies of Logic 120, the main component of the total delay may comprise the delay through a single copy of Logic 120 times three. Therefore, any reduction in the delay of Logic 120 accumulatively reduces the total delay.

If a sequential element, such as a flip-flop, is placed after a copy of Logic 120, such as Logic 120b, in order to reduce the total delay to fit within a predetermined clock cycle, then a costly pipeline stage has been inserted in the design. Further, in a subsequent clock cycle, Logic 120a does not receive the correct output signals from flip-flops 112 dependent upon the output of Logic 120f. In order to avoid incorrect operation, a stall needs to be inserted in the pipeline and the loop delay has grown to two costly clock cycles. For processor performance, it may be desirable to maintain this loop delay within one originally predetermined clock cycle.

Figure 6:
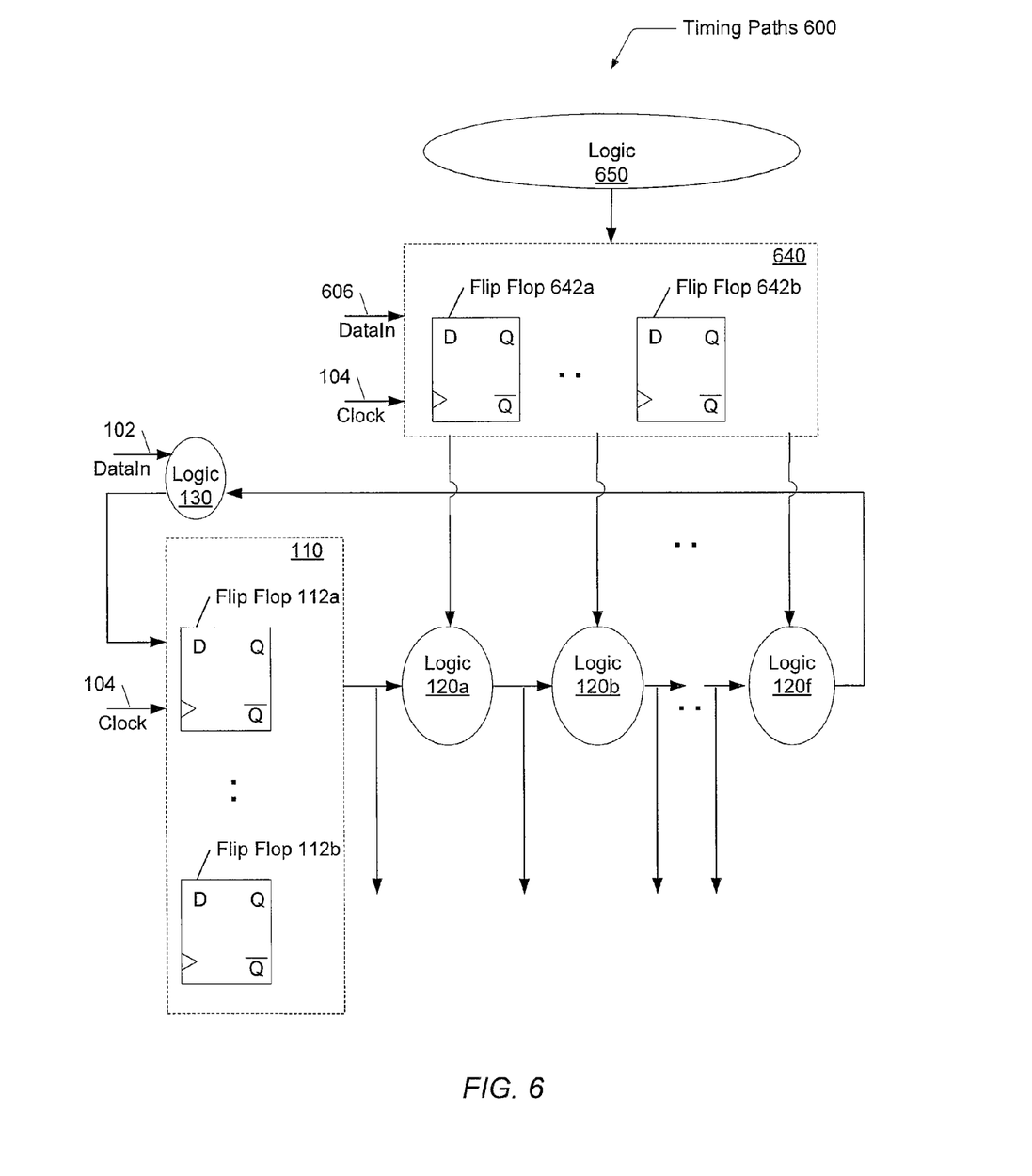
FIG. 6 is a generalized block diagram illustrating another embodiment of processor timing paths.

Turning now to FIG. 6, one embodiment of processor timing paths 600 is shown. Circuit portions corresponding to those shown in FIG. 1 are numbered the same. Here, the combinatorial logic within Logic 150 is moved to a previous pipeline stage into Logic 650. This movement of combinatorial logic may cause sequential elements 640 to have less flip-flops than required for original sequential elements 140 since original Logic 150 may have less output signals than input signals. Although the delay from sequential elements 140 to Logic 120 is reduced by utilizing Logic 650 and sequential elements 640 due to the movement of Logic 150, the total loop delay from sequential elements 110 through Logic 120 and 130 and back to sequential elements 110 remains the same. This total loop delay may not fit within a predetermined clock cycle.

Again if flip-flops are placed after a copy of Logic 120, such as Logic 120b, in order to reduce the total delay to fit within a predetermined clock cycle, then a costly pipeline stage has been inserted in the design. A costly pipeline stall is required for correct operation, since the logic within Logic 120 of a particular clock cycle is dependent on the final output of Logic 120f of the previous clock cycle.

Figure 7:
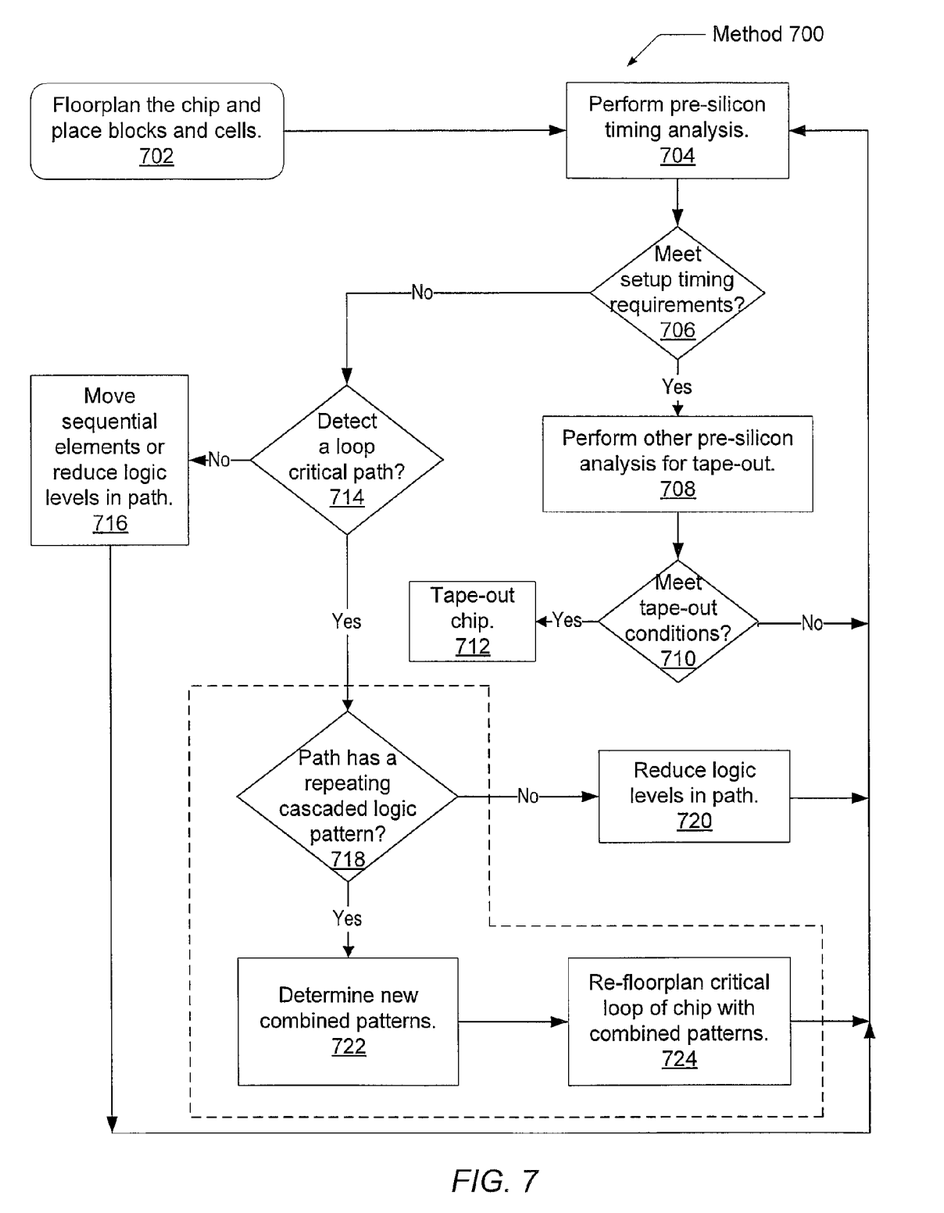
FIG. 7 is a generalized flow diagram of one embodiment of a method for increasing processor throughput by decreasing a loop critical path.

FIG. 7 illustrates a method 700 for increasing processor throughput by decreasing a loop critical path. Method 700 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment. In the embodiment shown, a semiconductor chip or a block within the semiconductor chip is floorplanned, individual sub-blocks are designed and placed in step 702, and local and global timing analysis is performed in block 704. Global routing and wire parasitic modeling may utilize approximations until late stages of the chip design are reached. A list of the top M timing paths that do not meet setup timing requirements or meet the timing requirements by a small threshold is documented.

If the documented list does not include any paths (conditional block 706), which may happen late in a design cycle, then other pre-silicon analysis for tape-out may continue to be performed in block 708. Such analysis may include architecture and circuit design modifications to remove issues regarding noise, power, hold time violations, and other. These modifications and the setup timing analysis may include a reiterative process.

If tape-out conditions are now met (conditional block 710), then the semiconductor chip may be taped out for post-silicon testing or production in block 712. Otherwise, control flow of method 700 returns to block 704. If there are setup timing violations (conditional block 706), but there are no loop critical paths (conditional block 714), then the timing violations include wire routes and logic gates between two separate sequential elements. These timing violations may be resolved in block 716 by further logic level reductions in the corresponding combinatorial logic, by resizing logic gates, by time borrowing clocking techniques, or by placing additional sequential elements within the path if it doesn't add costly pipeline stages. Control flow of method 700 then returns to block 704.

If there are loop critical paths (conditional block 714), then inspection of these paths may determine the existence of a repeating cascaded logic pattern (conditional block 718). For example, the path may have multiple instantiations of logic blocks, such as Logic 120 shown in FIG. 1 and FIG. 6. In one embodiment, each instantiation of logic may comprise the combinatorial logic shown in FIG. 2 or FIG. 3. Each instantiation except the first is dependent upon a previous instantiation, and, thus form a serial chain. If a loop critical path does not comprise such a cascaded chain of repeating logic (conditional block 718), then the timing violation may not significantly increase as the width of the processor increases such as incrementing from an instruction issue of N instructions to N+1 instructions. The timing violation may be removed in block 720 by means such as reducing the number of logic levels in the path, placing repeaters to drive long signal routes, and resizing logic gates.

If the loop critical path does comprise a cascaded chain of repeating logic (conditional block 718), then the timing violation may significantly increase as the width of the processor increases such as incrementing from an instruction operand renaming and instruction issue of N instructions to N+1 instructions. A determination of new combined patterns that does not include a long cascaded chain needs to be made in block 722 before the semiconductor chip is re-floorplanned with the new combined patterns in block 724.

For example, referring again to FIG. 6, in one embodiment, the computations performed in Logic 650 may be able to determine select line values for multiplexers in Logic 120*b*, such as multiplexers 210 in FIG. 2 or multiplexers 210, 314, and 316 in FIG. 3, such that the outputs of the multiplexers now incorporate the logic changes of Logic 120*a* without waiting for the completion of computations in Logic 120*a*. In other words, in FIG. 6, Logic 120*b* directly receives the output values of flip-flops 112, rather than receive the output values of Logic 120*a*, and Logic 120*b* still provides an output dependent on the computations in Logic 120*a*.

Logic 120*b* may receive select line values from sequential elements 640, but computed by Logic 650, that allows Logic 120*b* to correctly reorder the contents of registers in sequential elements 110 without first waiting for a reordering performed by Logic 120*a*. Such a computation of select line values that encompasses the reordering behavior of a previous instantiated logic block, such as Logic 120*a*, may be performed in Logic 650, since the necessary information regarding the reordering behavior may be extracted from corresponding instructions. Illustrative examples are shown below.

Referring again to FIG. 5 and FIG. 6, in one embodiment, rather than derive select line values for multiplexers within each logic block, such as Logic 120, that correspond to a reordering based on a single FP instruction, Logic 650 may compute select line values corresponding to a combined reordering based on multiple FP instructions. For example, in one embodiment, Logic 650 may currently determine a set of select line values for Logic 120*b* based solely on a second FP instruction of a group of three FP instructions, such as the FP exchange instruction shown in FIG. 5. Now, however, Logic 650 may determine a set of select line values for Logic 120*b* based on both the first and the second FP instructions of a group of three FP instructions, such as the FP load instruction and the FP exchange instruction.

A portion of the combinatorial logic within Logic 650 may receive the decoded opcodes of the FP load instruction and the FP exchange instruction and the specified offsets of these two instructions as inputs. The output of this portion of combinatorial logic within Logic 650 may be select lines to multiplexers in Logic 120*b* that result in the combined reordering of translate-table 310 by both the FP load instruction and the FP exchange instruction.

Referring to FIG. 5 and taking entry 3 as an example, a flip-flop in sequential elements 110 stores a 3-bit value 7. In one embodiment, Logic 120*b* may have an 8:1 multiplexer as shown in FIG. 2 that originally receives an input value of 0 as shown in FIG. 5 after a delay of t. This multiplexer of Logic 120*b* determines an output value 3 at time 2t based on both its select line values and the output values of Logic 210*a*. Logic 650 may have determined these select line values based solely on the FP exchange instruction. However, Logic 650 may determine the select line values based on both the FP load instruction and the FP exchange instruction.

In the case Logic 650 utilizes both the FP load instruction and the FP exchange instruction to derive multiplexer select lines in the above example, Logic 120*b* may not receive the output values of Logic 120*a*, but rather Logic 120*b* may directly receive the output values of flip-flops 112. Then after a delay of t, Logic 120*b* with no changes to its own logic, may convey its output values.

Figure 8:
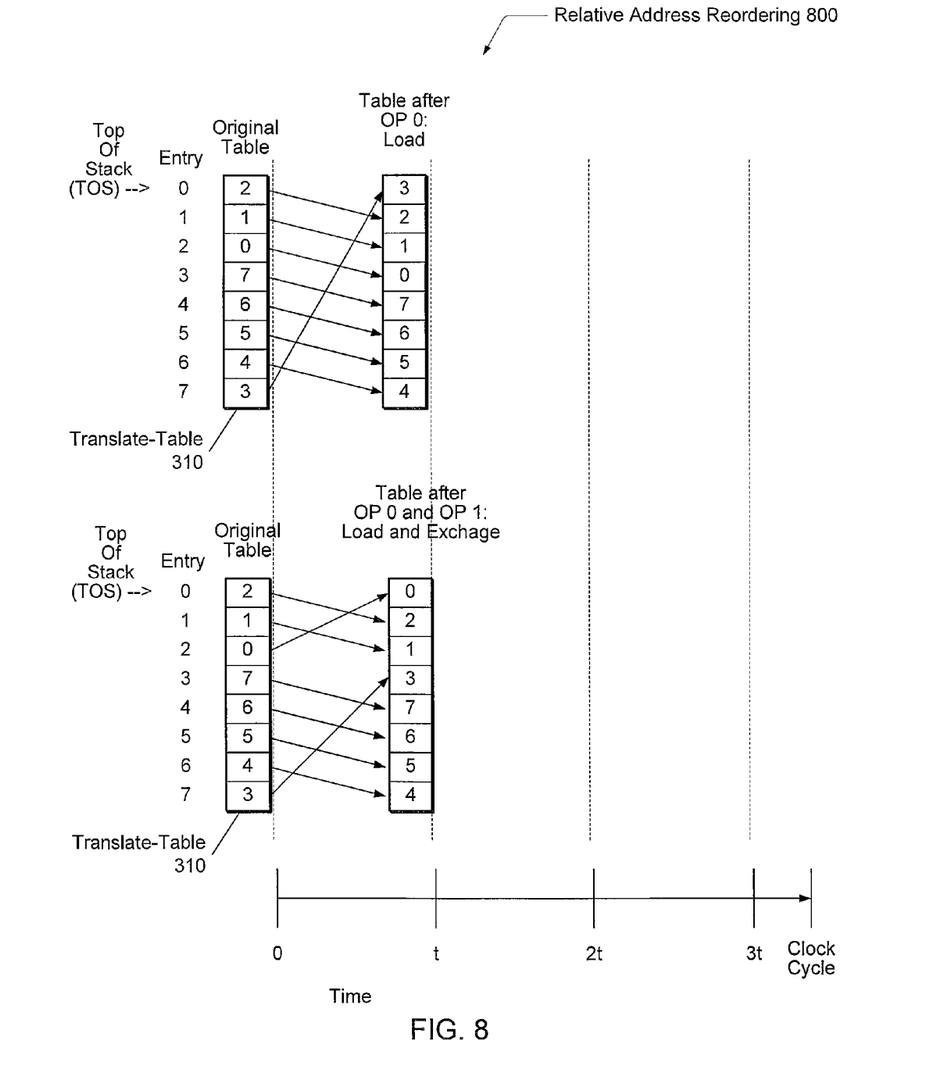
FIG. 8 is a generalized block diagram illustrating another embodiment of relative address reordering.

Turning now to FIG. 8, another embodiment of relative address reordering 800 is shown. In the example shown, at the beginning of a clock cycle, the original translate-table values stored within entries 0 to 7 are shown at time 0. In the embodiment shown, three instructions are able to have their corresponding operand relative stack specifier values translated within a single clock cycle. The corresponding operands may be renamed within the single clock cycle or in the next clock cycle depending on the architected pipeline.

A FP load instruction, a FP exchange instruction, and a FP add instruction have been fetched and decoded. Prior to operand renaming and scheduling, it is possible to determine a computational effect, or reordering in this embodiment, of the translate-table 310 values based on both the FP load instruction and the FP exchange instruction. As previously shown in FIG. 5, a FP load instruction has a corresponding stack relative operation, such as a push operation, on a multi-entry stack upon completion of its operation. A FP exchange instruction (FXCH) exchanges the contents of entry 0 with an entry specified by the FP exchange instruction. In the example shown, the FXCH instruction specifies entry 3.

In one embodiment, based on the select line values determined by Logic 650, the combined effects, or reordering, of the translate-table 310 are determined by multiplexers by time t, rather than by time 2t as before. In one embodiment, Logic 650 may receive the opcodes and other necessary fields, such as a specifier in the FXCH instruction, in order to determine a corresponding combined computational effect on an 8-entry stack based on two FP instructions within a clock cycle. In another embodiment, Logic 650 may be able to determine a corresponding combined computational effect on an 8-entry stack based on three or more FP instructions within a clock cycle. Resulting select lines or other control signals are subsequently conveyed to Logic 120.

As in the example of FIG. 5, the current stored values and current ordering of table 310 determines the destination and source operands of the FP load instruction. The appropriate values, such as the TOS value stored in entry 0 (e.g. 2) and the value stored in an entry specified by an offset within the FP load instruction, are used to index table 320. The corresponding values of table 320 are read out and input to flip-flops for register renaming in the subsequent clock cycle.

In one embodiment, Logic 120a is still required for computations in the example of FIG. 8 since the output values of Logic 120a determines the destination and source operands of the FP exchange instruction. The appropriate values, such as the TOS value stored in entry 0 (e.g. 3) and the value stored in an entry 3 (e.g. 0) specified by the FP exchange instruction, are used to index table 320. The corresponding values of table 320 are read out and input to flip-flops for register renaming in the subsequent clock cycle. Similarly, as before, the output values of Logic 120b may be used to determine the destination and source operands of the FP add instruction.

Significant time savings may be realized by computing the combined effects, or the reordering, of two FP instructions versus only one FP instruction. In another embodiment, Logic 650 may further determine the combined effects of three FP instructions: the FP load instruction, the FP exchange instruction, and the FP add instruction. The combined effects are stored as select line values in flip-flops 642. Logic 120f may receive both a portion of these stored select line values and the output values of flip-flops 112. Then after a time delay of t as shown in FIG. 8, Logic 120f may convey output values, in one embodiment, from its corresponding multiplexers.

Figure 9:
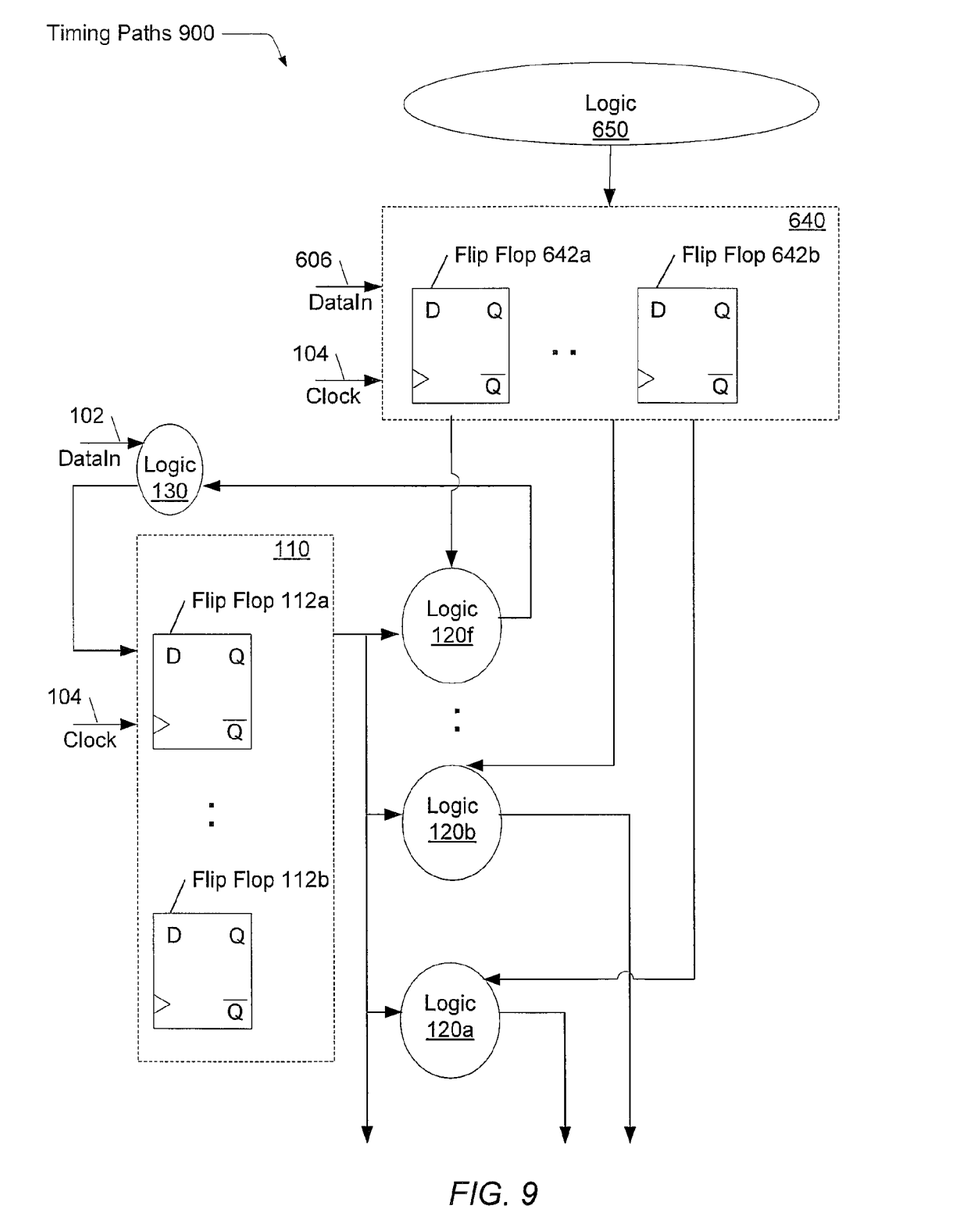
FIG. 9 is a generalized block diagram illustrating another embodiment of processor timing paths.

Turning now to FIG. 9, one embodiment of processor timing paths 900 is shown. Circuit portions corresponding to those shown in FIG. 1 and FIG. 6 are numbered the same. Here, each logic block, Logic 120a-120f, performs computations in parallel, rather than serially. Each logic block directly receives the outputs of flip-flops 112. In one embodiment, select line values computed by Logic 650 in a previous clock cycle are supplied to logic blocks Logic 120 by flip-flops 642.

In one embodiment, each of the logic blocks Logic 120 have combinatorial logic implemented by multiplexers as shown in FIG. 2 or in FIG. 3. Previously, with a serial chain as shown in FIG. 6, if the delay for one logic block, such as Logic 120a, is t, then the delay of the loop critical path of N logic blocks is proportional to Nt. Signal route delays, the delay of Logic 130, and setup and clock-to-q delays of flip-flops will cause the total delay to increase above Nt. Here, in FIG. 9, the loop delay is proportional to t, which may be much smaller than Nt.

Also, if the design of a next generation processor requires the instruction width of the processor to increase, such as incrementing from an instruction rename and issue of N instructions to N+1 instructions, the loop delay remains t. Before, in the serial chain in FIG. 6, the delay would have grown from Nt to (N+1)t. Therefore, a significant reduction in a path's total delay may be realized by recognizing a loop critical path with a cascaded repeating logic pattern, such as Logic 120a-120f. By parallelizing the computations of the logic blocks, as shown in FIG. 9, by computing combined effects of multiple instructions versus a single instruction, such as in Logic 650 or in Logic 150 if there is sufficient time, the total loop delay may no longer be the critical path on the chip.

In the embodiment shown in FIG. 9, it is possible for the fanout of each flip-flop 112 to increase to an unacceptable level as the width of instructions to rename and issue increases. Similarly, the number of logic levels in Logic 650 may increase to an unacceptable level that may not fit within a predetermined clock cycle. Therefore, the amount of parallelization may be reduced, but still yield a much smaller loop delay than a complete serialized chain.

Figure 10:
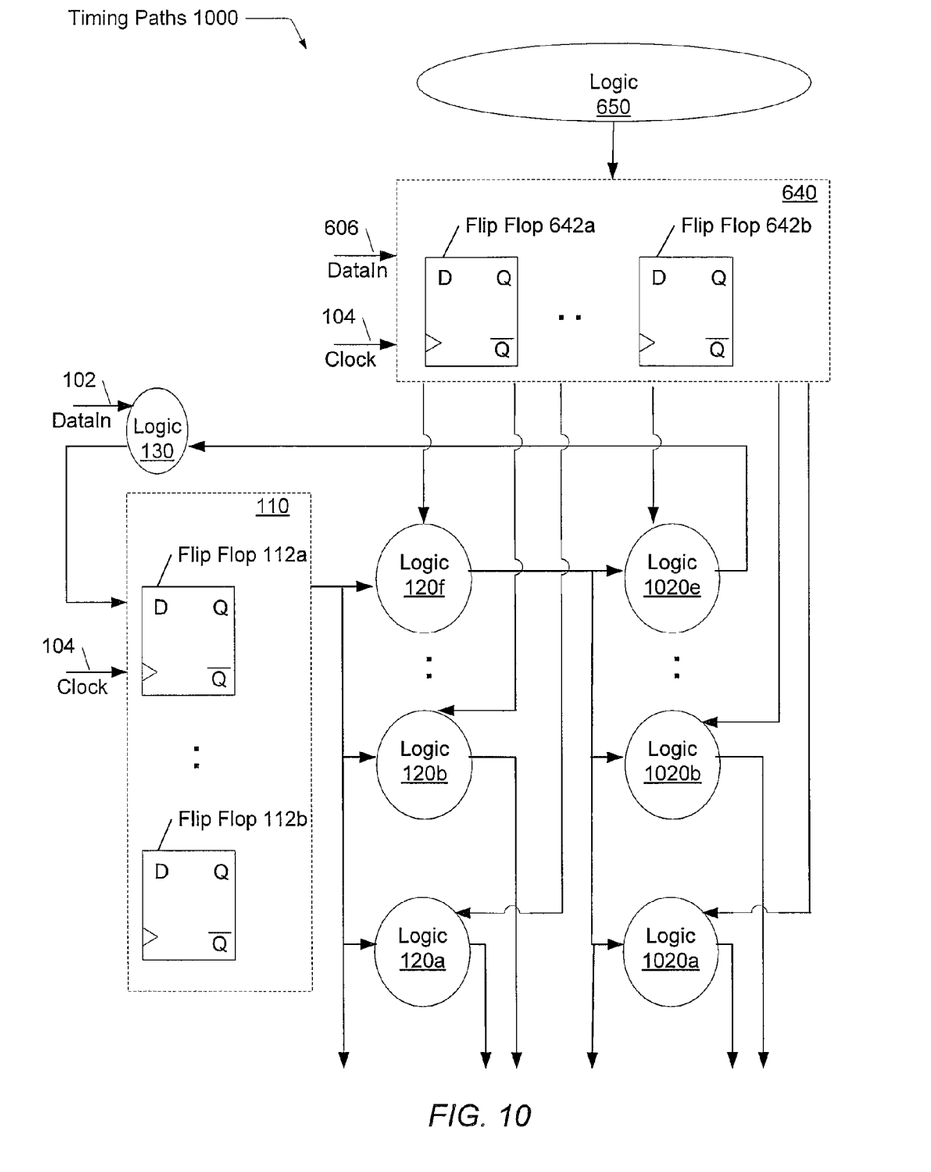
FIG. 10 is a generalized block diagram illustrating another embodiment of processor timing paths.

Referring to FIG. 10, one embodiment of processor timing paths 1000 is shown. Circuit portions corresponding to those shown in FIG. 1 and FIG. 6 are numbered the same. Here, in one embodiment, the number of instructions to rename and issue per clock cycle (e.g. N+1) may be split into two portions. For example, if there are 6 instructions to rename and issue, Logic 120 may perform computations for the first 3 instructions and Logic 1020 may perform computations for the next 3 instructions. Therefore, the fanout of each flip-flop 112 does not increase beyond the fanout required for 3 instructions, although 6 instructions have computations performed within the clock cycle.

Also, the number of logic levels for logic computations in Logic 650 remains at a required number for 3 instructions and does not grow to a number of logic levels required for 6 instructions. The loop delay does increase from being proportional to t to being proportional to 2t, but this delay is still far less than a delay proportional to 6t with a completely serialized chain.

Generally speaking, the claimed invention is disclosed above referring to any logic that may include a loop critical path with a repeating cascaded logic pattern. Above, floating-point operations are used in examples of loop critical paths. However, loop critical paths may exist for many other computations within a processor. Regarding floating-point operations and the illustrated examples, becoming more specific, the legacy x87 floating-point architecture is a source of difficulty for all x86 processor vendors implementing out-of-order processing.

The x87 floating-point unit (FPU) uses a stack with eight slots, or entries 0 to 7, with relative accessibility and not random accessibility. Each of these slots is an 80-bit register. Further complicating matters is the support of legacy MMX integer multi-media single-instruction multiple-data (SIMD) instructions. Each of the eight 64-bit MMX vector registers (the upper 16 bits of the x87 stack registers go unused in MMX, and these bits are set to all ones) aliased on the eight existing x87 floating-point registers within the x87 stack, could represent two 32-bit integers, four 16-bit short integers, or eight 8-bit bytes.

Floating point operations may be compiled to x87 instructions or Streaming SIMD Extensions (SSE or SSE2) instructions. The x87 floating-point instructions typically store intermediate results with 80 bits of precision, whereas SSE2 floating-point instructions use 64 bits of precision. When legacy floating-point software algorithms are ported to SSE2, certain combinations of math operations or input datasets can result in measurable numerical deviation. For critical scientific computations, this is a problem. However, this problem is beyond the scope of the present discussion and invention description. What is appreciated is the support of legacy x87 floating-point instructions and the difficulty that arises from its implementation regarding out-of-order issue of instructions in a superscalar microarchitecture.

As discussed earlier, the method for translating stack-based instruction sets into flat addressing for scheduling purposes includes a translate-table mechanism. This translate-table mechanism performs x87 stack to flat logical register renaming for N instructions per cycle. In one embodiment, a translate-table 310 is an array of eight 3-bit registers. These registers are address tags pointing to a particular future file address. The top-of-stack (TOS) pointer always points to the first element of this array, or entry 0. Thus, every time the TOS changes, the translate-table 310 must be shifted appropriately.

Relative operations that may be performed on this stack include Push, Pop, Double Pop, Nothing, and FXCH, wherein FXCH supports the swapping of the contents of entry 0 with the contents of any other entry. In addition, an MMX instruction sets the top-of-stack (TOS) to zero and the other entries within translate-table 310 must rotate accordingly. Any younger (in program order) operation following an MMX instruction must take into account the fact that the MMX instruction set the TOS to zero. For example, Logic 650 needs to account for MMX instructions.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system included in a processor comprising:
   a control signal generation block;
   N instantiated copies of combinatorial logic, each copy having one or more control input lines coupled to receive control signals from the control signal generation block when using the processor, and having one or more data output lines coupled to convey data output signals corresponding to the control signals, wherein N is an integer and N>1;
   wherein the data output signals of at least a (M−1)th copy of the instantiated copies is not received by a Mth copy, wherein the data output signals of each Mth copy are dependent upon the data output signals of a logically previous M−1 copies, wherein M is an integer and 2<M≦N;
   wherein each of the N copies of the instantiated copies are configured to have a same logic delay to convey respective said data output signals.

2. The system as recited in claim 1, wherein the control signal generation block is further configured to determine control signals corresponding to a combined computational effect to be conveyed to said Mth copy of the instantiated copies of at least a first instruction and a second instruction, wherein a computational effect is a stack relative operation based on an instruction.

3. The system as recited in claim 2, wherein an accumulative delay from a data input line of a first copy to a data output line of the Nth copy is less than or equal to (N−1)*time_delay, wherein each copy of the N instantiated copies has a same logic delay of time_delay to convey respective said data output signals.

4. The system as recited in claim 3, wherein the data output signals of P copies of the instantiated N copies are coupled to be used in a next clock cycle of a processor pipeline, wherein P is an integer and 1≦P≦N−1.

5. The system as recited in claim 3, further comprising a table comprising a plurality of table entries, each table entry comprising at least a table data value, wherein the table is configured to update the table data values based on received data output signals from said Nth copy.

6. The system as recited in claim 5, wherein Q copies of the instantiated N copies are coupled to receive said table data values, wherein Q is an integer and 2≦Q≦N.

7. The system as recited in claim 6, wherein said table data values are x87 floating-point stack register specifiers.

8. The system as recited in claim 7, wherein each copy of the instantiated copies is configured to perform stack operations on the stack register specifiers corresponding to x87 floating-point instructions including at least one of the following: push, pop, double-pop, and FXCH.

9. A method executable by a processor in a computer for use in a computing system, the method comprising:
   each of N copies of combinatorial logic in the computing system having one or more control input lines coupled to receive control signals from a control signal generation block, and having one or more data output lines coupled to convey data output signals corresponding to the control signals, wherein N is an integer and N>1;
   not receiving the data output signals of at least a (M−1)th copy of the instantiated copies received by a Mth copy, wherein the data output signals of each Mth copy are dependent upon the data output signals of a logically previous M−1 copies, wherein M is an integer and 2<M≦N;
   conveying respective said data output signals with a same logic delay by each of the N copies of the instantiated copies.

10. The method as recited in claim 9 further comprising determining control signals corresponding to a combined computational effect to be conveyed to said Mth copy of the instantiated copies of at least a first instruction and a second instruction, wherein a computational effect is a stack relative operation based on an instruction.

11. The method as recited in claim 10 further comprising having an accumulative delay from a data input line of a first copy to a data output line of the Nth copy less than or equal to (N−1)*time_delay, wherein each copy of the N instantiated copies has a same logic delay of time_delay to convey respective said data output signals.

12. The method as recited in claim 11 further comprising coupling the data output signals of P copies of the instantiated N copies to be used in a next clock cycle of a processor pipeline, wherein P is an integer and 1≦P≦N−1.

13. The method as recited in claim 11 further comprising updating table data values within a plurality of table entries of a table based on received data output signals from said Nth copy.

14. The method as recited in claim 13 further comprising receiving said table data values by Q copies of the instantiated N copies, wherein Q is an integer and 2≦Q≦N.

15. The method as recited in claim 14 wherein said table data values are x87 floating-point stack register specifiers.

16. The method as recited in claim 15 further comprising performing stack operations on the stack register specifiers by each of the N instantiated copies corresponding to x87 floating-point instructions including at least one of the following: push, pop, double-pop, and FXCH.

17. A combinatorial logic block comprising:
   an interface configured to communicate with a control signal generation block;
   N instantiated copies of combinatorial logic, each copy having one or more control input lines coupled to receive control signals from the control signal generation block, and having one or more data output lines coupled to convey data output signals corresponding to the control signals, wherein N is an integer and N>1;
   wherein the data output signals of at least a (M−1)th copy of the instantiated copies is not received by a Mth copy, wherein the data output signals of each Mth copy are dependent upon the data output signals of a logically previous M−1 copies, wherein M is an integer and 2<M≦N;
   wherein each of the N copies of the instantiated copies are configured to have a same logic delay to convey respective said data output signals.

18. The combinatorial logic block as recited in claim 17, wherein the received control signals correspond to a combined computational effect to be conveyed to said Mth copy of the instantiated copies of at least a first instruction and a second instruction, wherein a computational effect is a stack relative operation based on an instruction.

19. The combinatorial logic block as recited in claim 18, wherein an accumulative delay from a data input line of a first copy to a data output line of the Nth copy is less than or equal to (N−1)*time_delay, wherein each copy of the N instantiated copies has a same logic delay of time_delay to convey respective said data output signals.

20. The combinatorial logic block as recited in claim 19, wherein the data output signals of P copies of the instantiated N copies are coupled to be used in a next clock cycle of a processor pipeline, wherein P is an integer and $1 \leq P \leq N-1$.

* * * * *